(12) United States Patent
Su et al.

(10) Patent No.: US 11,417,454 B2
(45) Date of Patent: Aug. 16, 2022

(54) POWER CIRCUIT COMMON MODE FILTER

(71) Applicant: Zhuhai Group Innovation New Materials Technology Co., Ltd., Guangdong (CN)

(72) Inventors: Liliang Su, Guangdong (CN); Lifeng Su, Guangdong (CN)

(73) Assignee: Zhuhai Group Innovation New Materials Technology Co., Ltd., Guangdong (CN)

( * ) Notice: Subject to any disclaimer, the term of this patent is extended or adjusted under 35 U.S.C. 154(b) by 455 days.

(21) Appl. No.: 16/359,545

(22) Filed: Mar. 20, 2019

(65) Prior Publication Data
US 2019/0221355 A1 Jul. 18, 2019

(30) Foreign Application Priority Data

Sep. 20, 2018 (CN) .......................... 201821535921.8

(51) Int. Cl.
| | | |
|---|---|---|
| *H01F 17/04* | (2006.01) | |
| *H01F 27/26* | (2006.01) | |
| *H03H 1/00* | (2006.01) | |
| *H01F 27/28* | (2006.01) | |
| *H01F 27/29* | (2006.01) | |
| *H01F 1/34* | (2006.01) | |
| *H01F 27/32* | (2006.01) | |
| *H01F 27/30* | (2006.01) | |
| *H01F 3/10* | (2006.01) | |
| *H01F 27/255* | (2006.01) | |

(52) U.S. Cl.
CPC ............. *H01F 27/26* (2013.01); *H01F 1/344* (2013.01); *H01F 3/10* (2013.01); *H01F 27/2823* (2013.01); *H01F 27/29* (2013.01); *H01F 27/306* (2013.01); *H01F 27/324* (2013.01); *H03H 1/00* (2013.01); *H01F 27/255* (2013.01); *H03H 2001/0035* (2013.01); *H03H 2001/0092* (2013.01)

(58) Field of Classification Search
CPC .... H03H 2001/0092; H03H 2001/0035; H01F 27/324; H01F 27/306
USPC ......................................................... 336/221
See application file for complete search history.

*Primary Examiner* — Ronald Hinson

(57) ABSTRACT

A power circuit common mode filter includes: a U-shaped soft magnetic core and two cylindrical soft magnetic cores, wherein recessed grooves are provided at tops of two side walls of the U-shaped soft magnetic core, and the two cylindrical soft magnetic cores are movably installed in the U-shaped soft magnetic core; two ends of each of the cylindrical soft magnetic cores are embedded in the corresponding recessed grooves, and a coil is set on each of the two cylindrical soft magnetic cores in the U-shaped soft magnetic core; the U-shaped soft magnetic core and the cylindrical soft magnetic cores are both covered with a high-voltage-resist insulating material to form insulating layers; surfaces of the insulating layers at the recessed grooves are provided with electrode layers, and ends of the coil is fixedly connected to the electrode layers through soldering tin.

3 Claims, 2 Drawing Sheets

POWER CIRCUIT COMMON MODE FILTER

CROSS REFERENCE OF RELATED APPLICATION

The present invention claims priority under 35 U.S.C. 119(a-d) to CN 201821535921.8, filed Sep. 20, 2018.

BACKGROUND OF THE PRESENT INVENTION

Field of Invention

The present invention relates to a filter, and more particularly to a power circuit common mode filter.

Description of Related Arts

Conventional, a power circuit common mode filter inductor is prepared as a one-piece soft ferrite core, wherein the soft magnetic core is formed by adding a sheet-like soft magnetic core cover on a "Π"-shaped soft magnetic core, and then respectively winding two coils with same number of turns on two columns of the "Π". Polarities of inlet and outlet lines of the coils are completely the same, which means same ends have same polarities. This method is complicated in process with all manual operation, leading to extremely low production efficiency. The threading needs to be fully manual, during which the insulting layer of the enameled wire is easy to be scratched, causing internal short circuit of the coil. As a result, the product quality is extremely unstable and the machine is easy to burn when using.

SUMMARY OF THE PRESENT INVENTION

An object of the present invention is to provide a power circuit common mode filter with a combined structure.

Accordingly, in order to accomplish the above object, the present invention provides a power circuit common mode filter, comprising: a U-shaped soft magnetic core and two cylindrical soft magnetic cores, wherein recessed grooves are provided at tops of two side walls of the U-shaped soft magnetic core, and the two cylindrical soft magnetic cores are movably installed in the U-shaped soft magnetic core in parallel; two ends of each of the two cylindrical soft magnetic cores are embedded in the corresponding recessed grooves; the two cylindrical soft magnetic cores are in a same plane after installation, and a coil is set on each of the two cylindrical soft magnetic cores in the U-shaped soft magnetic core; the U-shaped soft magnetic core and the two cylindrical soft magnetic cores are both covered with a high-voltage-resist insulating material to form insulating layers; surfaces of the insulating layers at the recessed grooves are provided with electrode layers, and ends of the coil is fixedly connected to the electrode layers through soldering tin.

The recessed grooves have a stepped shape with a higher outer portion and a lower inner portion; stepped insert blocks are provided at the two ends of each of the two cylindrical soft magnetic cores, wherein the stepped insert blocks are embedded with the recessed grooves for positioning.

The U-shaped soft magnetic core and the two cylindrical soft magnetic cores are made of a nickel-zinc ferrite, a manganese-zinc ferrite or an alloy material.

After adopting the above scheme, the coil can be wound by a self-winding machine to provide high efficiency, and a coating film of the coil is not damaged. Therefore, cost is reduced, efficiency is increased and product quality is improved. The cylindrical soft magnetic core is assembled with the coil before being assembled with the U-shaped soft magnetic core, which is simple and efficient to operate, and can be produced by a production line with external equipment.

DETAILED DESCRIPTION OF THE PREFERRED EMBODIMENT

Figure 1:
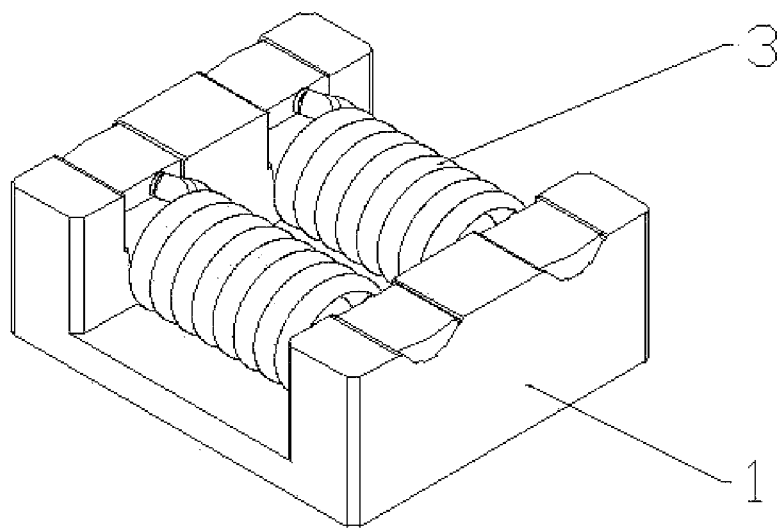
FIG. 1 is an overall sketch view of the present invention.
Figure 2:
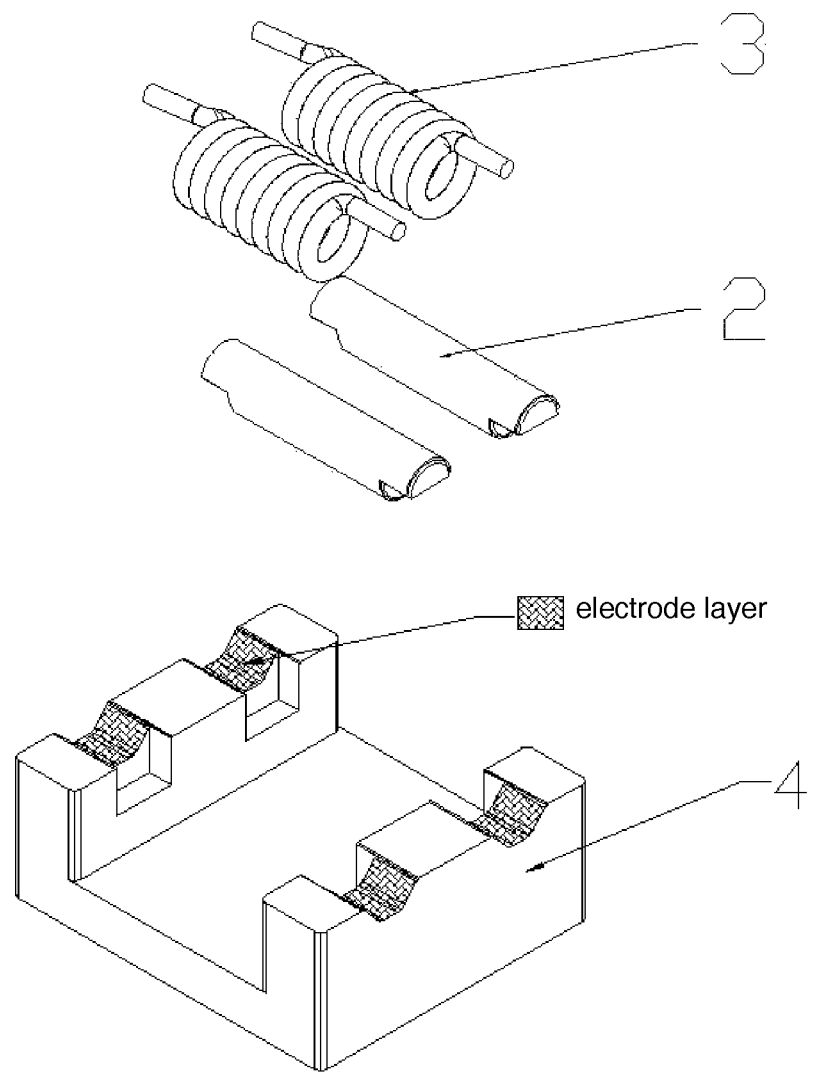
FIG. 2 is an exploded view of the present invention.

Referring to the drawings, the present invention will be further illustrated. A preferred embodiment is shown in FIGS. 1 and 2. The preferred embodiments shows a power circuit common mode filter, comprising: a U-shaped soft magnetic core 1 and two cylindrical soft magnetic cores 2, wherein recessed grooves 4 are provided at tops of two side walls of the U-shaped soft magnetic core 1, and the two cylindrical soft magnetic cores 2 are movably installed in the U-shaped soft magnetic core 1 in parallel; two ends of each of the two cylindrical soft magnetic cores 2 are embedded in the corresponding recessed grooves 4; the two cylindrical soft magnetic cores 2 are in a same plane after installation, and a coil 3 is set on each of the two cylindrical soft magnetic cores 2 in the U-shaped soft magnetic core 1; the U-shaped soft magnetic core 1 and the two cylindrical soft magnetic cores 2 are both covered with a high-voltage-resist insulating material to form insulating layers; surfaces of the insulating layers at the recessed grooves 4 are provided with electrode layers, and ends of the coil 3 is fixedly connected to the electrode layers through soldering tin; the recessed grooves 4 have a stepped shape with a higher outer portion and a lower inner portion; stepped insert blocks are provided at the two ends of each of the two cylindrical soft magnetic cores 2, wherein the stepped insert blocks are embedded with the recessed grooves 4 for positioning; the U-shaped soft magnetic core 1 and the two cylindrical soft magnetic cores 2 are made of a nickel-zinc ferrite, a manganese-zinc ferrite or an alloy material.

A method for preparing the above filter comprises steps of: forming a U-shaped soft magnetic core and a cylindrical soft magnetic core—processing electrodes of the U-shaped soft magnetic core—automatically forming a coil and pre-welding—assembling the coil with the cylindrical soft magnetic core—dispensing at four grooves of the U-shaped soft magnetic core—assembling the U-shaped magnetic core with the two cylindrical soft magnetic cores equipped with the coils—baking—wiring—soldering—processing appearance—printing and testing package.

The insulating layer is prepared by dissolving cerium oxide and ethyl cellulose in diethylene glycol butyl ether while adding a trace metal element to form a slurry, and applying the slurry to a surface of an entire soft magnetic core. A high-voltage-resist insulating material layer is formed after baking and sintering, wherein the high-voltage-resist insulating material layer is an inorganic insulating layer. A weight percentage of cerium oxide:ethyl cellulose: diethylene glycol butyl ether is 50-70%: 2-20%: 15-40%. Or, the high-voltage-resist insulating material layer by dissolving high-temperature resin, nitromethylpyrrolidone in methyl isobutyl ketone while adding a small amount of special resin to form a slurry, and applying the slurry to a surface of an entire soft magnetic core. The high-voltage-resist insulating material layer is formed after baking and sintering, wherein the high-voltage-resist insulating material layer is an inorganic insulating layer. A weight percentage of high temperature resistant resin:nitromethylpyrrolidone:methyl isobutyl ketone is 2-15%: 50-75%: 15-41%.

The electrodes are processed on the surfaces of the insulating layers at the recessed grooves 4 to form the electrode layers, and electrode processing comprises:

<1> water plating treatment: placing a silver material layer on the insulating layer at an electrode position, placing a nickel material layer on the silver material layer, and placing a tin material layer on the nickel material layer, so as to form an electrode coating layer; and <2> PVD vacuum sputter coating: first vacuum-sputtering a chromium material layer on the high-voltage-resist insulating material layer, then vacuum-sputtering a nickel material layer of the chromium material layer, and finally vacuum-sputtering a silver material layer on the nickel material layer; or vacuum-sputtering an aluminum material layer on the high-voltage-resist insulating material layer, then vacuum-sputtering a nickel material layer of the aluminum material layer, and finally vacuum-sputtering a tin material layer on the nickel material layer.

The embodiment described above is only one of the preferred embodiments of the present invention, and is not intended to limit the scope of implementation of the present invention. Therefore, this invention includes all modifications encompassed within the spirit and scope of the following claims.

What is claimed is:

1. A power circuit common mode filter, comprising: a U-shaped soft magnetic core (1) and two cylindrical soft magnetic cores (2), wherein recessed grooves (4) are provided at tops of two side walls of the U-shaped soft magnetic core (1), and the two cylindrical soft magnetic cores (2) are movably installed in the U-shaped soft magnetic core (1) in parallel; two ends of each of the two cylindrical soft magnetic cores (2) are embedded in the corresponding recessed grooves (4); the two cylindrical soft magnetic cores (2) are in a same plane after installation, and a coil (3) is set on each of the two cylindrical soft magnetic cores (2) in the U-shaped soft magnetic core (1); and ends of the coil (3) is fixedly connected to electrode layers through soldering tin.

2. The power circuit common mode filter, as recited in claim 1, wherein the recessed grooves (4) have a stepped shape with a higher outer portion and a lower inner portion; stepped insert blocks are provided at the two ends of each of the two cylindrical soft magnetic cores (2), wherein the stepped insert blocks are embedded with the recessed grooves (4) for positioning.

3. The power circuit common mode filter, as recited in claim 1, wherein the U-shaped soft magnetic core (1) and the two cylindrical soft magnetic cores (2) are made of a nickel-zinc ferrite, a manganese-zinc ferrite or an alloy material.

* * * * *